(12) United States Patent
Chien

(10) Patent No.: US 10,132,834 B2
(45) Date of Patent: Nov. 20, 2018

(54) PROBE

(71) Applicant: PEACEFUL THRIVING ENTERPRISE CO., LTD., Changhua County (TW)

(72) Inventor: Shih-Hsiang Chien, Changhua County (TW)

(73) Assignee: PEACEFUL THRIVING ENTERPRISE CO., LTD., Changhua County (TW)

( * ) Notice: Subject to any disclaimer, the term of this patent is extended or adjusted under 35 U.S.C. 154(b) by 89 days.

(21) Appl. No.: 15/343,231

(22) Filed: Nov. 4, 2016

(65) Prior Publication Data

US 2018/0128854 A1 May 10, 2018

(51) Int. Cl.
*G01R 1/20* (2006.01)
*G01R 1/067* (2006.01)
(Continued)

(52) U.S. Cl.
CPC ........... *G01R 1/06733* (2013.01); *G01K 1/14* (2013.01); *G01K 13/00* (2013.01)

(58) Field of Classification Search
CPC .. G01R 15/207; G01R 29/0878; G01R 27/02; G01R 27/2605; G01R 29/0871; G01R 1/06711; G01R 1/06727; G01R 1/06788; G01R 21/12; G01R 27/16; G01R 29/0814; G01R 31/002; G01R 31/026; G01R 31/041; G01R 31/2874; G01R 31/2879; G01R 31/2891; G01R 33/34046; G01R 15/144; G01R 15/146; G01R 15/18; G01R 1/0408; G01R 1/0416; G01R 27/26; G01R 27/2676; G01R 31/31715; G01R 31/3191; G01R 31/3192; G01R 31/2601; G01R 31/31924; G01R 33/34015; G01R 35/00; A61B 18/1477; A61B 18/1815; A61B 2018/00577; A61B 2018/00642; A61B 2018/00702; A61B 2018/00714; A61B 2018/0072; A61B 2018/00755; A61B 2018/00761; A61B 2018/00767; A61B 2018/14; A61B 2018/007; A61B 2018/1427; A61B 2018/1823; A61B 2018/1869; A61B 5/0507; A61B 5/4836; A61N 1/3718; A61N 5/045; A61N 1/05; A61N 1/08
See application file for complete search history.

(56) References Cited

U.S. PATENT DOCUMENTS 5,162,725 A * 11/1992 Hodson ................. G01D 3/022
324/103 R
6,308,089 B1 * 10/2001 von der Ruhr .......... A61B 5/00
600/338
(Continued)

*Primary Examiner* — Vinh Nguyen
(74) *Attorney, Agent, or Firm* — Raymond Y. Chan; David and Raymond Patent Firm

(57) ABSTRACT

A probe as an accessory of an electronic device that measures electrical properties is revealed. The probe sends the signals detected to a display. The probe includes a first detection part and a second detection part. The first detection part detects voltage of an appliance and sends signals to a display for showing messages related to voltage. The second detection part measures temperature of an electrical device and transmits signals to a display for showing messages related to temperature.

20 Claims, 6 Drawing Sheets

(51) Int. Cl.
*G01K 13/00* (2006.01)
*G01K 1/14* (2006.01)

(56) References Cited

U.S. PATENT DOCUMENTS

| | | | |
|---|---|---|---|
| 6,705,158 B1* | 3/2004 | Louden | G01F 1/68 |
| | | | 73/170.12 |
| 8,049,527 B2* | 11/2011 | Lee | H03F 1/30 |
| | | | 324/750.3 |
| 8,947,097 B2* | 2/2015 | Muller | G01R 15/142 |
| | | | 324/416 |
| 2015/0044531 A1* | 2/2015 | Itagaki | G01R 19/0084 |
| | | | 429/90 |

* cited by examiner

PROBE

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a probe, especially to a probe used for measurement of parameters of electrical systems. A front end of the probe is in direct contact with circuit of the electrical system to measure voltage or temperature of a current carrying conductor of the electrical system being detected. The probe is connected to a multimeter, a clamp meter or other measurement devices while in use and is used for providing signals of the electrical device being detected and measuring changes in electrical parameters.

Description of Related Arts

All electrical devices have some means of protecting against overload. Once an overload condition occurs, it causes a circuit breaker/safety switch to trip. The electrical device in which the breaker/safety switch often trips is kept at high temperature for a long time and having the higher risk of fire. Besides voltage and current, electricians also detect operating temperature of a distribution panel while checking conditions of the distribution board. Infrared thermometers or thermal imagers are used to evaluate whether the distribution board works normally and whether the power is distributed well. Once one of the switches has a high load, the temperature of both the wire and the switch is higher than others.

At least two kinds of devices are required for checking conditions. One is the thermal imager and the other is the voltage tester. Thus the electrician needs to carry at least two devices and the measurement should be done at least twice. Thus there is a need to combine the voltage tester with the temperature probe into a bi-functional probe. The two tests (voltage and temperature) can be done at once by only one probe.

SUMMARY OF THE PRESENT INVENTION

Therefore it is a primary object of the present invention is to provide a probe that combines the voltage probe with the temperature probe for detecting voltage and temperature at once.

In order to achieve the above object, a probe according to the present invention includes a main body that extends to form a head part. One end of the head part is disposed with an opening. A first detection part and a second detection part are projected from the opening. The main body is hollow and is arranged with a first transmission line and a second transmission line therein. One end of the first transmission line is connected to the first detection part while one end of the second transmission line is connected to the second detection part. The first detection part provides a voltage signal of an appliance detected and sends the voltage signal to a display through the first transmission line for showing messages related to the voltage detected (voltage messages). The second detection part provides a temperature signal of an appliance detected and sends the temperature signal to the same display through the second transmission line for showing messages of the temperature detected (temperature messages). The first transmission line is extended from the main body to connect to a first plug while the second transmission line is extended from the main body to connect to a second plug.

The first plug is plugged into a display for outputting the voltage messages. The display can be a multi-meter or a clamp meter. The second plug is plugged into the same display for outputting the temperature messages.

The present invention features on that the first detection part is connected to the first transmission line independently and the second detection part is connected to the second transmission line independently. The second detection part is at an axial center of the first detection part and is partially/or completely covered by the first detection part.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
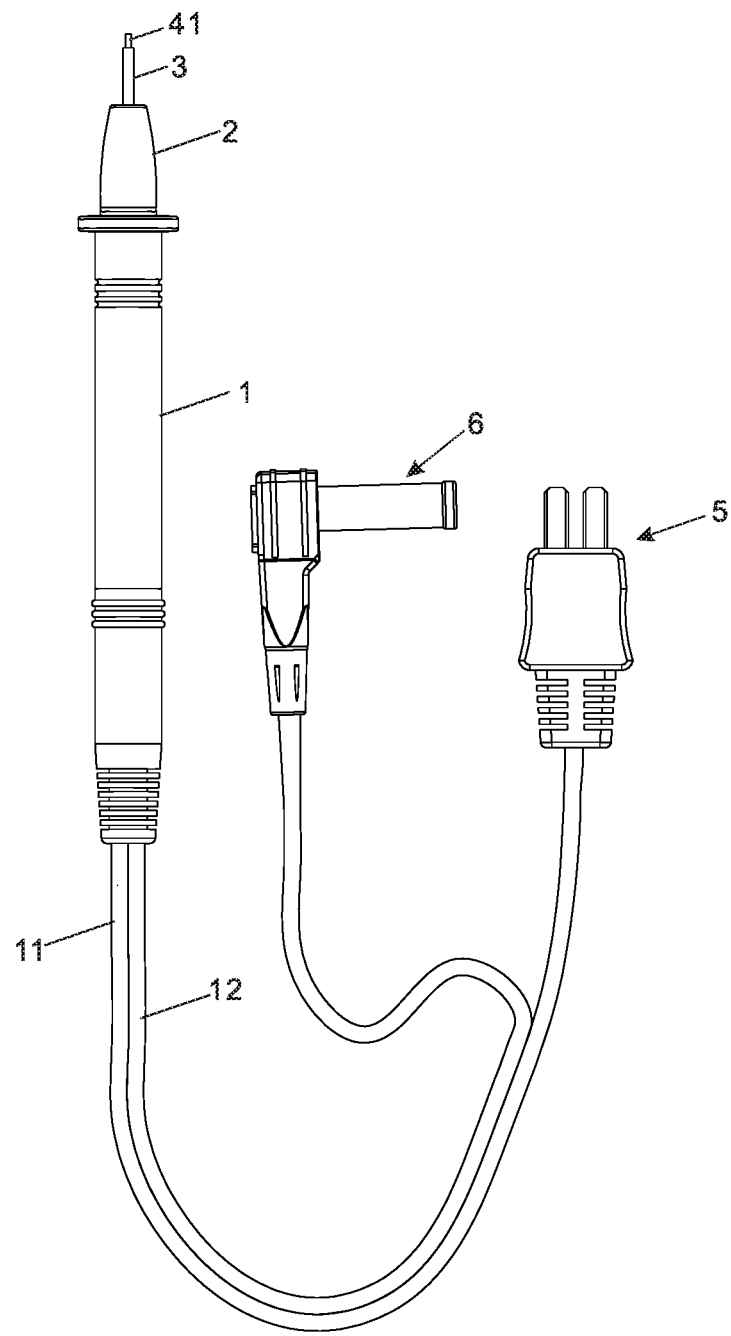
FIG. 1 is a perspective view of an embodiment according to the present invention.
Figure 2:
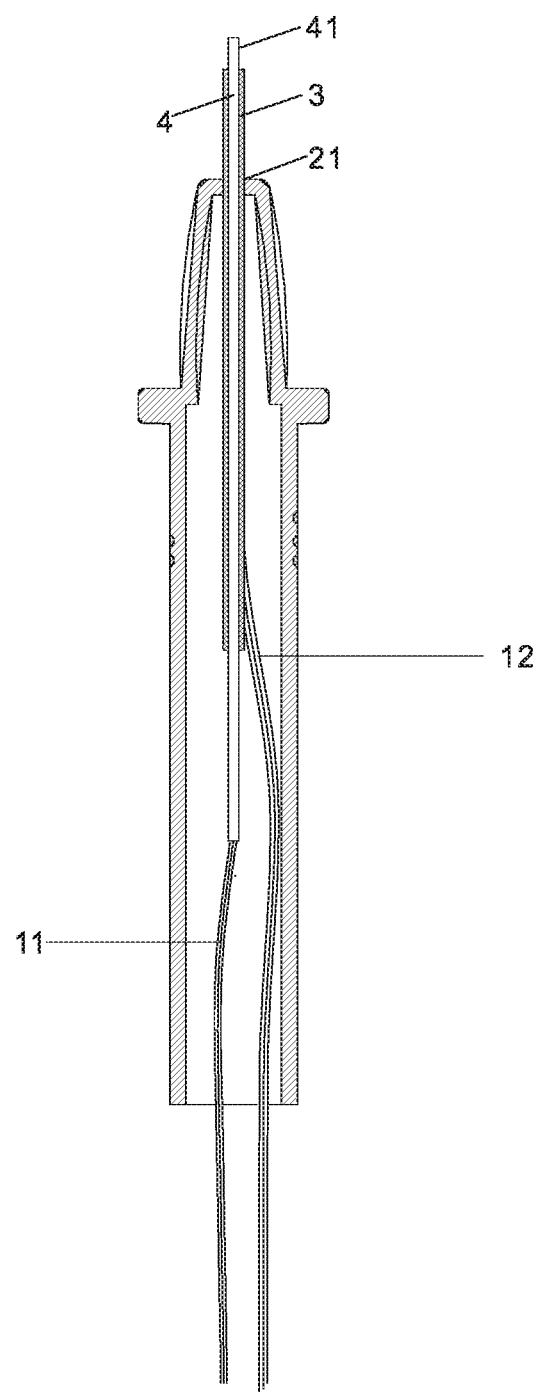
FIG. 2 is a longitudinal sectional view of the embodiment in FIG. 1 according to the present invention.
Figure 3:
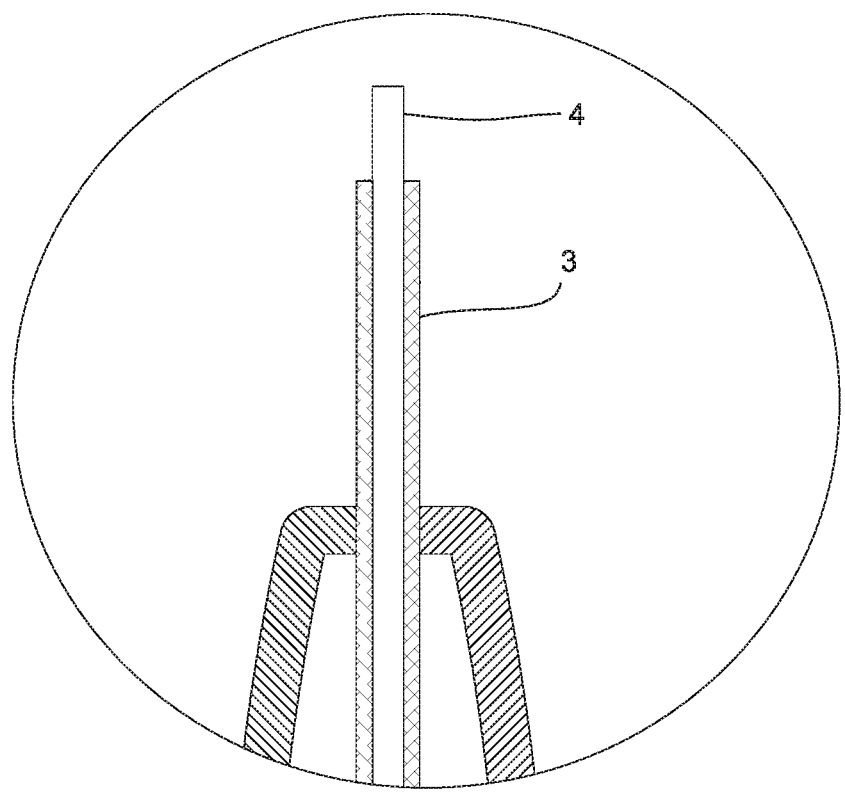
FIG. 3 is a partial enlarged view of a longitudinal section of a first detection part and a second detection part of the embodiment in FIG. 1 according to the present invention.

Refer to FIG. 1, FIG. 2 and FIG. 3, a probe of the present invention includes a main body 1, a head part 2, a first detection part 3, a second detection part 4, a second plug 5 and a first plug 6. The main body 1 is hollow. The head part 2 is extended from the main body 1 and one end of the head part 2 is disposed with an opening 21. The first detection part 3 and the second detection part 4 are projected from the opening 21 and are connected tightly to become a probe form. The main body 1 is arranged with a first transmission line 12 and a second transmission line 11 therein. One end of the first transmission line 12 is connected to the first detection part 3 while one end of the second transmission line 11 is connected to the second detection part 4. The first detection part 3 is connected to the first transmission line 12 independently and the second detection part 4 is connected to the second transmission line 11 independently while the first detection part 3 is located outside and around the second detection part 4. As shown in FIG. 3, the second detection part 4 is located at an axial center of the first detection part 3 and is partially covered by the first detection part 3. A front end 41 of the second detection part 4 is exposed, outside the first detection part 3. The first detection part 3 is made from conductive materials such as metals and so is the second detection part 4. The second detection part 4 is a thermal sensor and the first detection part 3 is a metal conductor.

The first detection part 3 provides a voltage signal of an appliance detected and sends the voltage signal to a display through the first transmission line 12 for showing messages related to the voltage detected. The second detection part 4 provides a temperature signal of an appliance detected and sends the temperature signal to the same display through the second transmission line 11 for showing messages of the temperature detected. The first transmission line 12 is connected to a wire of the display for signal transmission and so is the second transmission line 11 while the first transmission line 12 and the second transmission line 11 are separated from each other. The first transmission line 12 is extended from the main body 1 to connect to the first plug 6 and the second transmission line 11 is extended from the main body 1 to connect to the second plug 5.

The first plug 6 is plugged into a display (not shown in figure). The display is used to show an output signal from the electrical system being detected. The display can be a multi-meter or a clamp meter used for outputting the messages related to the voltage. As to the second plug 5, it's plugged into the same display for outputting the messages related to the temperature. The first detection part 3 is used to contact with the electrical system and provide voltage signals. The voltage signals are sent and input into a processor through the first transmission line 12 and the first plug 6 plugged into a processor built in a display (not shown in figure) for showing messages related to the voltage. The second detection part 4 in contact with detects the temperature of the electrical system and sends the temperature signal to the processor built-in the display (not shown in figure) through the second transmission line 11 and the second plug 5 for showing messages related to the temperature.

Figure 4:
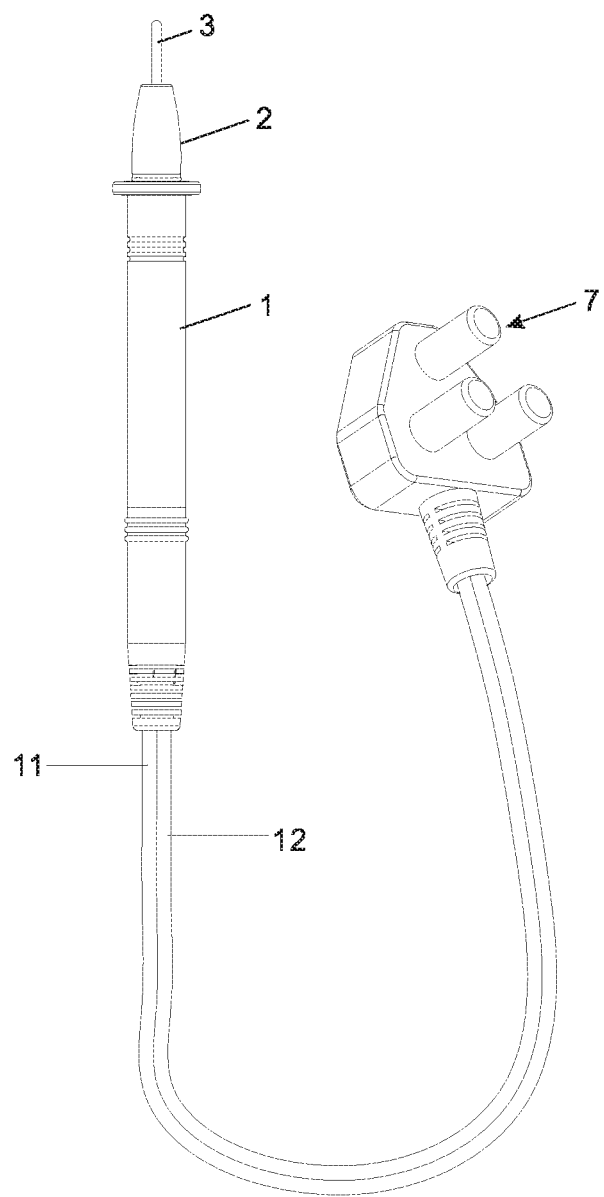
FIG. 4 is a perspective view of another embodiment according to the present invention.
Figure 5:
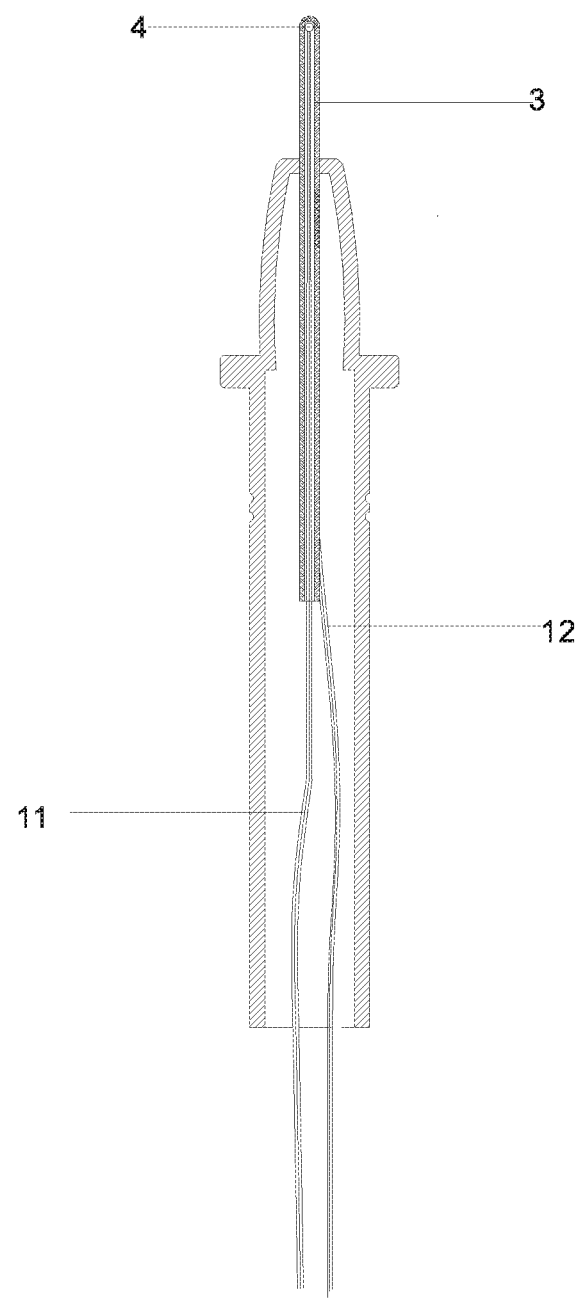
FIG. 5 is a longitudinal section of the embodiment in FIG. 4 according to the present invention.
Figure 6:
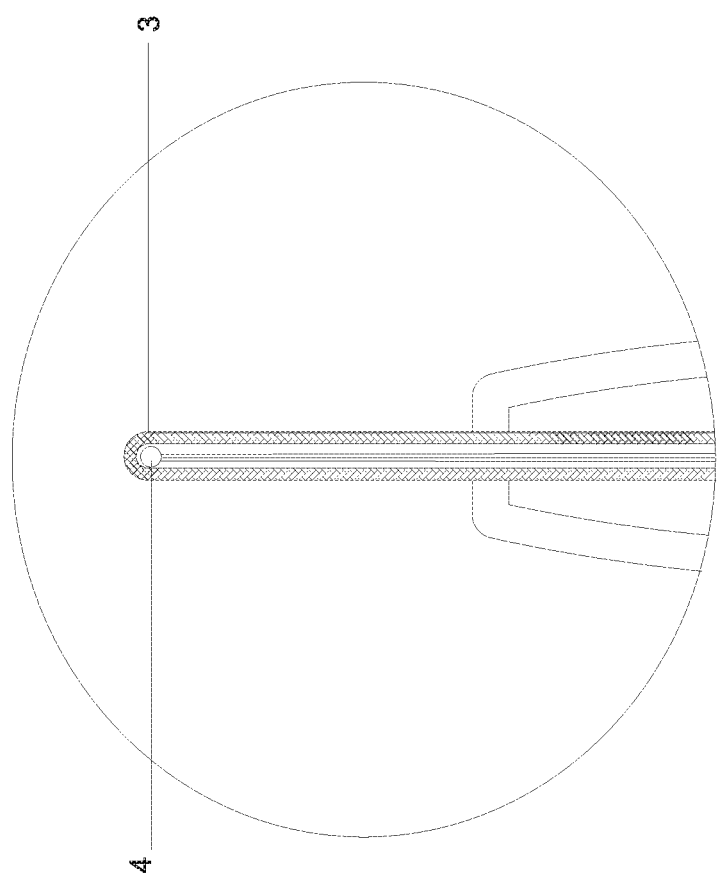
FIG. 6 is a partial enlarged view of a longitudinal section of a first detection part and a second detection part of the embodiment in FIG. 4 according to the present invention.

Refer to FIG. 4, FIG. 5 and FIG. 6, another embodiment is revealed. In this embodiment, the second detection part 4 is located at an axial center of the first detection part 3 and is completely covered by the first detection part 3, without exposed outside. In other words, the second detection part 4 is hidden inside the first detection part 3. The first detection part 3 is made from conductive materials such as metals. The second detection part 4 is also made from conductive materials and a surface of the second detection part 4 is covered by an insulation layer. The main body 1 is disposed with a first transmission line 12 and a second transmission line 11 therein. One end of the first transmission line 12 is connected to the first detection part 3 while one end of the second transmission line 11 is connected to the second detection part 4. The first detection part 3 is connected to the first transmission line 12 independently and the second detection part 4 is connected to the second transmission line 11 independently. The first transmission line 12 and the second transmission line 11 are connected in parallel and extended from the main body 1 to connect to a third plug 7. Thus the signals detected are input into the processor built-in the display (not shown in figure) through the third plug 7 for showing messages related to temperature and voltage. Refer to the FIG. 5, the first transmission line 12 and the second transmission line 11 are separated from each other and connected to the first plug 6 and the second plug 5 of the above embodiment respectively. The first transmission line 12 and the second transmission line 11 of the above embodiment can also be connected in parallel to connect to the third plug 7.

Moreover, the second detection part 4 of the second embodiment can be made from non-conductive materials. There is no insulation layer covered the second detection part 4 when the second detection part 4 is made from non-conductive material.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe as an accessory of an electronic device that measures electrical properties, and used for sending signals detected to a display comprising:
   a main body that is hollow;
   a head part formed by extension of the main body and one end thereof disposed with an opening;
   a first detection part projected from the opening; and
   a second detection part projected from the opening;
   a first transmission line disposed in the main body and having one end thereof connected to the first detection part and the other end thereof exposed and located outside the main body; and
   a second transmission line arranged and having one end thereof connected to the second detection part and the other end thereof exposed and located outside the main body;
   wherein the second detection part is at an axial center of the first detection part and is partially covered by the first detection part; a front end of the second detection part is exposed and located outside the first detection part; the first detection part and the second detection part are connected tightly; the first detection part is used for providing voltage signals of an electrical device being detected while the second detection part is a sensor that measures temperature.

2. The probe as claimed in claim 1, wherein the first detection part is made from conductive materials such as metals and the second detection part is made from conductive materials.

3. The probe as claimed in claim 1, wherein the second detection part is able to be completely covered by the first detection part.

4. The probe as claimed in claim 3, wherein the second detection part is made from conductive materials and a surface of the second detection part is covered by an insulation layer.

5. The probe as claimed in claim 3, wherein the second detection part is made from insulation materials and there is no insulation layer covered a surface of the second detection part.

6. The probe as claimed in claim 3, wherein a front end of the second detection part is hidden in the first detection part.

7. The probe as claimed in claim 6, wherein the second detection part is at an axial center of the first detection part.

8. The probe as claimed in claim 1, wherein a surface of the second detection part is covered by an insulation layer.

9. The probe as claimed in claim 1, wherein a front end of the second detection part is exposed and located outside the first detection part.

10. The probe as claimed in claim 1, wherein the first transmission line is extended from the main body to connect to a first plug and the second transmission line is extended from the main body to connect to a second plug.

11. The probe as claimed in claim 1, wherein the first transmission line and the second transmission line are connected in parallel and extended from the main body to connect to a plug.

12. A probe used as an accessory of an electronic device for measuring electrical properties, and used for sending signals detected to a display comprising:
 a main body;
 a first detection part projecting from one end of the main body;
 a second part projecting from one end of the main body;
 a first transmission line disposed in the main body and having one end thereof connected to the first detection part and the other end thereof exposed and located outside the main body; and
 a second transmission line arranged and having one end thereof connected to the second detection part and the other end thereof exposed and located outside the main body;
 wherein the second detection part is covered by the first detection part and a front end of the second detection part is exposed and located outside the first detection part; the first detection part is used for providing voltage signals of an electrical device being detected while the second detection part is a sensor that measures temperature.

13. The probe as claimed in claim 12, wherein the second detection part is able to be completely covered by the first detection part.

14. The probe as claimed in claim 13, wherein the second detection part is hidden in the first detection part.

15. The probe as claimed in claim 12, wherein the first detection part and the second detection part are connected tightly.

16. The probe as claimed in claim 12, wherein the first detection part is made from conductive materials such as metals and the second detection part is made from conductive materials.

17. The probe as claimed in claim 16, wherein a surface of the second detection part is covered by an insulation layer.

18. The probe as claimed in claim 16, wherein the second detection part is made from insulation materials and there is no insulation layer covered a surface of the second detection part.

19. The probe as claimed in claim 12, wherein the first transmission line is extended from the main body to connect to a first plug and the second transmission line is extended from the main body to connect to a second plug.

20. The probe as claimed in claim 12, wherein the first transmission line and the second transmission line are connected in parallel and extended from the main body to connect to a third plug.

* * * * *